(12) United States Patent
Lee et al.

(10) Patent No.: US 7,655,943 B2
(45) Date of Patent: Feb. 2, 2010

(54) ORGANIC ELECTROLUMINESCENT DISPLAY DEVICE HAVING OTFT AND METHOD OF FABRICATING THE SAME

(75) Inventors: Hun-Jung Lee, Suwon-si (KR); Min-Chul Suh, Suwon-si (KR); Jae-Bon Koo, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 444 days.

(21) Appl. No.: 11/253,198

(22) Filed: Oct. 18, 2005

(65) Prior Publication Data

US 2006/0091395 A1    May 4, 2006

(30) Foreign Application Priority Data

Oct. 28, 2004    (KR) .................... 10-2004-0086779

(51) Int. Cl.
  *H01L 29/08*    (2006.01)
(52) U.S. Cl. .............. 257/40; 257/59; 257/72; 257/347; 257/E51.007; 257/E51.018; 257/E21.024; 438/171; 438/216; 438/780
(58) Field of Classification Search ............ 257/40, 257/59, 72, 347, E51.007, E51.018, E21.024; 438/171, 216, 780
See application file for complete search history.

(56) References Cited

U.S. PATENT DOCUMENTS

| 6,057,896 A * | 5/2000 | Rho et al. ............ 349/42 |
| 6,603,139 B1 * | 8/2003 | Tessler et al. .......... 257/40 |
| 7,230,267 B2 * | 6/2007 | Nagayama et al. ........ 257/40 |
| 7,259,805 B2 * | 8/2007 | Song et al. ............. 349/38 |
| 2003/0116764 A1 * | 6/2003 | Fujikawa et al. ........ 257/57 |

FOREIGN PATENT DOCUMENTS

| KR | 10 2003 0057408 A | 7/2003 |
| KR | 10 2003 0058150 A | 7/2003 |
| KR | 10-2004-0028010 | 4/2004 |
| KR | 10-2004-0049110 | 6/2004 |

OTHER PUBLICATIONS

Notice to Submit Response by Korean Intellectual Property Office on Jul. 31, 2006.

* cited by examiner

*Primary Examiner*—Asok K Sarkar
(74) *Attorney, Agent, or Firm*—Knobbe Martens Olson & Bear LLP (57) ABSTRACT

An organic electroluminescent display device having an organic thin film transistor (OTFT) and a method of fabricating the same is disclosed. The display device can maintain an insulation property of a TFT and concurrently, ensure a sufficient capacitance by using an organic insulating layer for a gate insulating layer and using an inorganic insulating layer for a capacitor dielectric. In one embodiment, the organic electroluminescent display device includes a substrate having a capacitor region and a transistor region, a TFT formed in the transistor region of the substrate, and having a gate electrode, an organic semiconductor layer, a source electrode, and a drain electrode, a capacitor formed in the capacitor region of the substrate, and having a lower electrode and an upper electrode, and a display element connected to one of source/drain electrodes of the TFT. In one embodiment, a gate insulating layer formed below or on the gate electrode of the TFT includes at least an organic insulating layer, and a capacitor dielectric formed between the upper and lower electrodes of the capacitor includes an inorganic insulating layer.

25 Claims, 7 Drawing Sheets

ORGANIC ELECTROLUMINESCENT DISPLAY DEVICE HAVING OTFT AND METHOD OF FABRICATING THE SAME

CROSS-REFERENCE TO RELATED PATENT APPLICATION

This application claims the benefit of Korean Patent Application No. 10-2004-0086779, filed on Oct. 28, 2004, in the Korean Intellectual Property Office, the disclosure of which is incorporated herein in its entirety by reference.

BACKGROUND OF THE INVENTION

1. Field of the Invention

The present invention relates to a flat display device, and more particularly, to an organic electroluminescent display device having an organic thin film transistor in which a gate insulating layer uses an organic insulating layer, and a capacitor dielectric uses an inorganic insulating layer, and a method of fabricating the same.

2. Description of the Related Technology

An organic thin film transistor (OTFT) has been actively researched as a driving element of a next-generation display device. The OTFT uses an organic layer as a semiconductor layer instead of a silicon layer. The OTFT can be classified into a low molecular OTFT such as oligothiophene, pentacene, etc., and a polymer OTFT such as polythiophene, etc., in accordance with the composition of the organic layer.

Korean Patent Publication No. 2004-0028010 discloses an OTFT using an organic insulating layer as a gate insulating layer. It uses an optical orientation element to an organic polymer layer for a gate insulating layer to increase the orientation of an organic active layer. Further, Korean Patent Publication No. 2004-0049110 discloses a thin film transistor having a trench formed in an insulating layer which in turn is formed on a gate insulating layer and an organic semiconductor layer formed in the trench.

An organic electroluminescent display device using such an OTFT as a switching element includes at least two OTFTs, for example, one switching OTFT and one drive OTFT, one capacitor, and an organic electroluminescent element having an organic layer between upper and lower electrodes.

Figure 1:
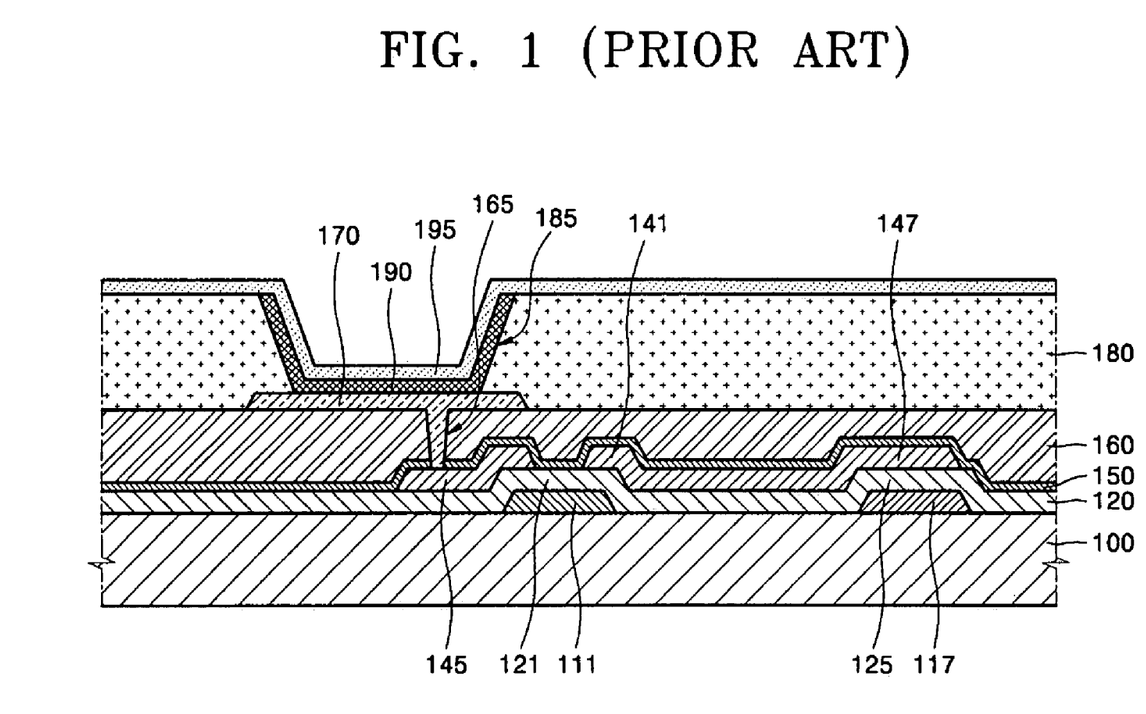
FIG. 1 is a sectional view of a conventional organic electroluminescent display device having an organic thin film transistor (OTFT).

FIG. 1 is a sectional view illustrating a conventional organic electroluminescent display device having an OTFT.

Referring to FIG. 1, a drive OTFT for driving (i.e., providing current to) the organic electroluminescent element, a capacitor, and an organic electroluminescent element are formed on a substrate 100. The OTFT includes a gate electrode 111, a source electrode 141 and a drain electrode 145 formed on a gate insulating layer 121, and a semiconductor layer 150 formed on the substrate 100. The capacitor includes a lower electrode 117 formed on the substrate 100, and an upper electrode 147, which is connected to the source electrode 141 of the OTFT. A capacitor dielectric 125 is interposed between the lower electrode 117 and the upper electrode 147.

The organic electroluminescent element includes i) an anode electrode 170 as a lower electrode, which is formed on a protecting layer 160 and connected to the drain electrode 145 through a via hole 165, ii) an organic layer 190, and iii) a cathode electrode 195 as an upper electrode formed on the overall surface of the substrate 100. A pixel definition layer 180 is formed on the protecting layer 160 and has an opening 185 exposing a portion of the anode electrode 170. An organic layer 190 is formed on the anode electrode 170 exposed by the opening 185.

The organic electroluminescent display device having the OTFT described as above has an insulating layer 120 formed on the gate electrode 111, the lower electrode 117 of the capacitor, and the substrate 100. The insulating layer 120 serves as a gate insulating layer of the thin film transistor (TFT) as well as a dielectric layer of the capacitor. That is, a portion 121 of the insulating layer 120, which is interposed between the gate electrode 111 of the TFT and a semiconductor layer 150, serves as a gate insulating layer of the TFT. A portion 125 of the insulating layer 120, which is interposed between the upper electrode 147 and the lower electrode 117 of the capacitor, serves as a dielectric layer of the capacitor.

The OTFT structured as above is employed in a flexible flat display device and the like, and an organic material is used as a gate insulating layer. Generally, an organic material such as PVA, etc., has a dielectric constant as low as about 4.9. Thus, if the organic material is used as a gate insulating layer, the layer must be thick in order to maintain the requisite insulation.

However, where that the gate insulating layer is too thick, the capacitor which uses a portion of the layer as a capacitor dielectric may have deficient capacitance.

On the other hand, if the organic gate insulating layer is too thin, the capacitor may function properly, but the desired level of insulation for the gate may not be adequate.

SUMMARY OF CERTAIN INVENTIVE ASPECTS

One aspect of the present invention provides an organic electroluminescent display device having an organic thin film transistor (OTFT) and a method of fabricating the same for maintaining an insulation property of a TFT and concurrently, ensuring a sufficient capacitance by using at least an organic insulating layer for a gate insulating layer of the TFT, and using an inorganic insulating layer for a capacitor dielectric.

Another aspect of the present invention provides an organic electroluminescent display device having an OTFT and a method of fabricating the same for maintaining a high capacitance and an insulation property of a TFT without decreasing an opening rate.

Another aspect of the present invention provides a flat display device including i) a substrate having a capacitor region and a transistor region, ii) a TFT formed in the transistor region of the substrate, and having a gate electrode, a semiconductor layer, a source electrode, and a drain electrode, iii) a capacitor formed in the capacitor region of the substrate, and having a lower electrode and an upper electrode, and iv) a display element connected to one of source/drain electrodes of the TFT. In one embodiment, the semiconductor layer includes an organic semiconductor layer, a gate insulating layer formed below or on the gate electrode of the TFT includes at least an organic insulating layer, and a capacitor dielectric formed between the upper and lower electrodes of the capacitor includes an inorganic insulating layer.

In one embodiment, the gate insulating layer may further include an inorganic insulating layer formed below or on the organic insulating layer, and the inorganic insulating layer used as the capacitor dielectric may have a thickness equal to or thinner than that of the organic insulating layer used as the gate insulating layer.

In one embodiment, the inorganic insulating layer used as the capacitor dielectric may include an insulating layer selected from a silicon oxide layer and a silicon nitride layer, or a high-k inorganic insulating layer, and the gate insulating layer may include an organic insulating layer selected from polyimide, BCB, parylene, PVP, and optical hardening resin.

In one embodiment, the organic semiconductor layer may include an organic layer selected from pentacene, tetracene, anthracene, naphthalene, alpha-6-thiophene, perylene, and its derivatives; rubrene and its derivatives; coronene and its derivatives; perylene tetracarboxylic diimide and its derivatives; perylene tetracarboxylic dianhydride and its derivatives; polythiophene and its derivatives; poly para perylene vinylene and its derivatives; polyfloren and its derivatives; and polythiophene vinylene and its derivatives.

Another aspect of the present invention provides a method of fabricating a flat display device. In one embodiment, the method comprises i) providing a substrate having a capacitor region and a transistor region, ii) forming a TFT in the transistor region of the substrate, and the TFT having a gate electrode, an organic semiconductor layer, a source electrode, and a drain electrode, iii) forming a capacitor in the capacitor region of the substrate, and the capacitor having a dielectric interposed between a lower electrode and an upper electrode, iv) connecting a display element to the TFT. The method also comprises v) preparing a substrate having the lower electrode in the capacitor region and the gate electrode in the transistor region, and vi) forming a capacitor dielectric having an inorganic insulating layer in the capacitor region, and forming a gate insulating layer having at least an organic insulating layer in the transistor region.

In one embodiment, the above procedure vi) may include forming an organic insulating layer on the overall surface of the substrate, removing the organic insulating layer corresponding to the capacitor region, forming an inorganic insulating layer on the substrate, and patterning the inorganic insulating layer, thereby leaving the inorganic insulating layer only in the capacitor region from which the organic insulating is removed.

In another embodiment, the procedure vi) may include forming an inorganic insulating layer on the overall surface of the substrate, removing the inorganic insulating layer corresponding to the transistor region, forming an organic insulating layer on the substrate; and leaving the organic insulating layer only in the transistor region from which the inorganic insulating layer is removed.

In another embodiment, the procedure vi) may include forming an inorganic insulating layer on the overall surface of the substrate, forming an organic insulating layer on the inorganic insulating layer, and removing the organic insulating layer corresponding to the capacitor region such that the gate insulating layer includes the inorganic insulating layer and the organic insulating layer.

In still another embodiment, the procedure vi) may include forming an organic insulating layer on the overall surface of the substrate, removing the organic insulating layer corresponding to the capacitor region, and forming an inorganic insulating layer on the overall surface of the substrate such that and the gate insulating layer includes the inorganic insulating layer and the organic insulating layer.

In one embodiment, the organic insulating layer of the capacitor region may be removed by a process selected from a laser ablation process, a photolithography and etch process, and an exposure and development process.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 2:
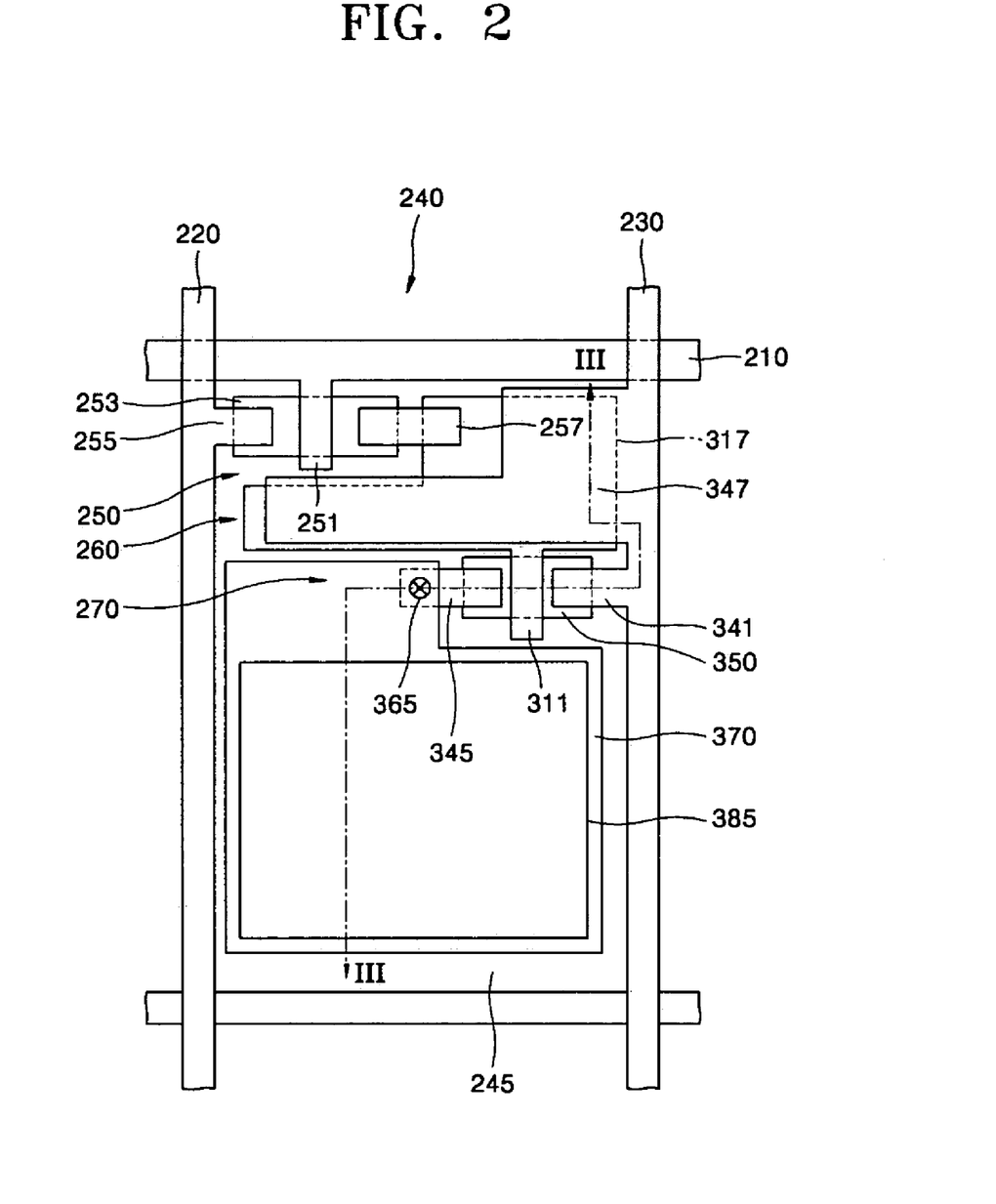
FIG. 2 is a top plan view of an organic electroluminescent display device having an OTFT according to an embodiment of the present invention.

FIG. 2 is a plan view of an organic electroluminescent display device having an organic thin film transistor (OTFT) according to an embodiment of the present invention, and illustrates a planar structure of one pixel.

Referring to FIG. 2, the organic electroluminescent display device includes a gate line 210, a data line 220 and a power line 230, a pixel region 245 confined by the gate line 210, the data line 220 and the power line 230, and a pixel 240 aligned to the pixel region 245.

The pixel 240 includes one switching OTFT 250, one drive OTFT 270, one capacitor 260, and an organic electroluminescent element having an anode electrode 370 as a lower electrode. The switching OTFT 250 includes a gate electrode 251 connected to the gate line 210, a semiconductor layer 253, and source/drain electrodes 255, 257. A gate insulating layer (not shown) is formed between the gate electrode 251 and the source/drain electrodes 255, 257. In one embodiment, the gate insulating layer is formed of an organic material.

The capacitor 260 includes a lower electrode 317 connected to a drain electrode 257 of the switching OTFT 250, and an upper electrode 347 overlapping the lower electrode 317 and connected to the power line 230. An inorganic insulating layer 327 (FIG. 3) as a capacitor dielectric is formed between the lower electrode 317 and the upper electrode 347.

The drive OTFT 270 includes a gate electrode 311 connected to the lower electrode 317 of the capacitor 260, a semiconductor layer 350, a source electrode 341 connected to the power line 230, and a drain electrode 345 connected to the pixel electrode 370. An organic insulating layer 321 (FIG. 3) is formed between the gate electrode 311 and the source/drain electrodes 341, 345.

Figure 3:
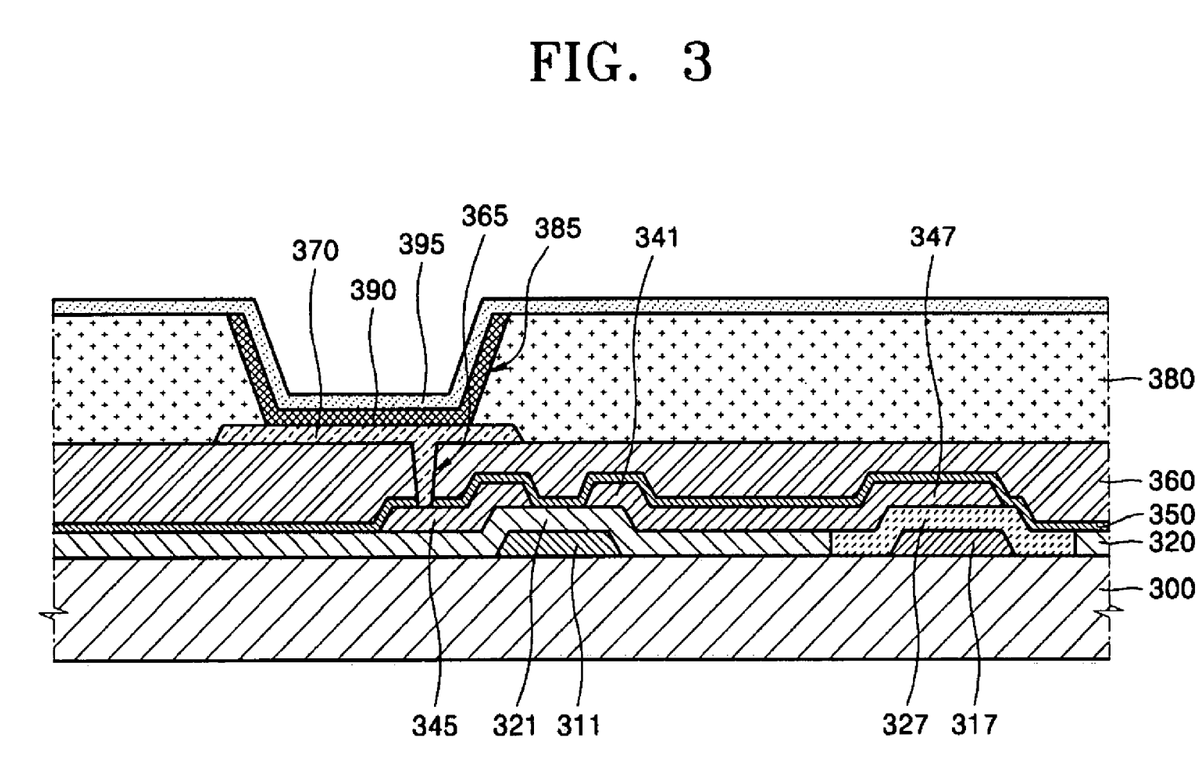
FIG. 3 is a sectional view of an organic electroluminescent display device having an OTFT according to an embodiment of the present invention.

In one embodiment, the gate insulating layer 321 of the OTFT 270 constituting one pixel is formed of an organic material having an appropriate level of insulation for the TFT. Furthermore, since the dielectric 327 of the capacitor is formed of an inorganic insulating layer, a capacitance of the capacitor can be sufficiently ensured.

FIG. 3 is a sectional view of an organic electroluminescent display device according to an embodiment of the present invention. FIG. 3 only shows the drive OTFT 270 (See FIG. 2), the capacitor 260 (See FIG. 2), and an organic electroluminescent element (EL) in one pixel, and illustrates a sectional structure taken along a line of III-III of FIG. 2.

Referring to FIG. 3, a gate electrode 311 of the OTFT 270 is formed on a transistor region of a substrate 300 such as glass, silicon, plastic, and the like. A lower electrode 317 of a capacitor is formed in a capacitor region thereof. In one embodiment, the lower electrode 317 is formed of the same material as that of the gate electrode 311. In one embodiment, an organic insulating layer 320 is formed in a substrate portion except for the capacitor region. The transistor region means a portion of the substrate 300 where the OTFT 270 is formed, and the capacitor region means a portion of the substrate 300 where the capacitor 260 is formed.

A portion of the insulating layer 320 corresponding to the transistor region, for example, a portion 321 on the gate electrode 311 acts as a gate insulating layer. In one embodiment, the insulating layer 320 includes an organic material selected from benzocyclobutene (BCB), polyimide, parylene and polyvinylphenol (PVP). In another embodiment, the organic insulating layer 320 may use optical hardening resin such as negative photoresist or positive photoresist. In one embodiment, the organic insulating layer 320 is formed with an appropriate thickness dimension required for a TFT, thereby maintaining adequate insulation for the TFT.

In one embodiment, an inorganic insulating layer is formed for the capacitor dielectric on the substrate portion corresponding to the capacitor region. In one embodiment, the capacitor dielectric 327 includes an inorganic insulating layer such as a silicon oxide layer and a silicon nitride layer, etc. or a high-k inorganic insulating layer such as $Ta_2O_5$, $Y_2O_3$, $TiO_2$, BST, PZT, and BZT.

In an embodiment of the present invention, an organic insulating layer is formed as a gate insulating layer 321, and an inorganic insulating layer is formed as a capacitor dielectric 327 having substantially the same thickness as that of the gate insulating layer 321, thereby ensuring an insulation property of a TFT, and a sufficient capacitance.

That is, an organic insulating layer is formed in the transistor region having a thickness required for a gate insulating layer for a TFT. In one embodiment, an inorganic insulating layer 327 is formed as a capacitor dielectric in the capacitor region and a high dielectric constant.

In an embodiment of the present invention, the capacitor dielectric 327 and the gate insulating layer 321 are formed with substantially the same thickness, so as to maintain adequate capacitance and insulation, respectively. In another embodiment of the present invention, the organic gate insulating layer 321 may be formed with an appropriate thickness required in the TFT, and the inorganic insulating layer 327 may be formed with a thickness thinner than that of the gate organic insulating layer 321, so as to further increase capacitance. Therefore, the capacitor has higher capacitance compared to that of the conventional organic electroluminescent display device.

The source electrode 341 and the drain electrode 345 are formed on the organic gate insulating layer 321 to overlap both sides of the gate electrode 311, and a capacitor upper electrode 347 is formed so as to be connected to the source electrode 341. In one embodiment, the capacitor upper electrode 347 is formed from the same material as those of the source electrode 341 and the drain electrode 345. It is also formed on the capacitor dielectric, made with the inorganic material 327, so as to overlap the lower electrode 317.

An organic semiconductor layer 350 is formed over the substrate 300. While the organic semiconductor layer 350 is formed on the overall surface of the substrate 300 in FIG. 3, in one embodiment, the organic semiconductor layer 350 is formed into a specific shape as illustrated in FIG. 2. FIG. 2 is a planar view illustrating the structural relationship of the organic semiconductor layer 350 and the gate electrode 311, and the source electrode 341 and the drain electrode 345. In various embodiments, the organic semiconductor layer 350 may be formed on the overall surface of the substrate 300 as shown in FIG. 3, or it may be formed into a specific shape as shown in FIG. 2.

In one embodiment, the organic semiconductor layer 350 includes an organic layer selected from pentacene, tetracene, anthracene, naphthalene, alpha-6-thiophene, perylene, and its derivatives; rubrene and its derivatives; coronene and its derivatives; perylene tetracarboxylic diimide and its derivatives; perylene tetracarboxylic dianhydride and its derivatives; polythiophene and its derivatives; poly para perylene vinylene and its derivatives; polyfloren and its derivatives; and polythiophene vinylene and its derivatives.

A protecting layer 360 having a viahole 365 exposing one of the source electrode 341 and the drain electrode 345 is formed on the organic semiconductor layer 350. An anode electrode 370 as a pixel electrode is formed on the protecting layer 360 to be connected to the drain electrode 345 through the viahole 365.

A pixel definition layer 380 having an opening 385 exposing a portion of the anode electrode 370 is formed over the substrate 300. An organic layer 390 is formed on the anode electrode 370 inside the opening 385, and a cathode electrode 395 is formed on the overall surface of the substrate 300. In one embodiment, the organic layer 390 includes at least one of the following: a hole injection layer, a hole transfer layer, an organic luminescent layer, an electron transfer layer, an electron injection layer, and a hole barrier layer.

According to an embodiment of the present invention as described above, an organic insulating layer is formed as a gate insulating layer of a TFT, and an inorganic insulating layer is formed as a capacitor dielectric. That is, since the gate insulating layer and the capacitor dielectric are formed of different types of insulating materials, respectively, the TFT is properly insulated, and a sufficient capacitance is obtained.

Figure 4:
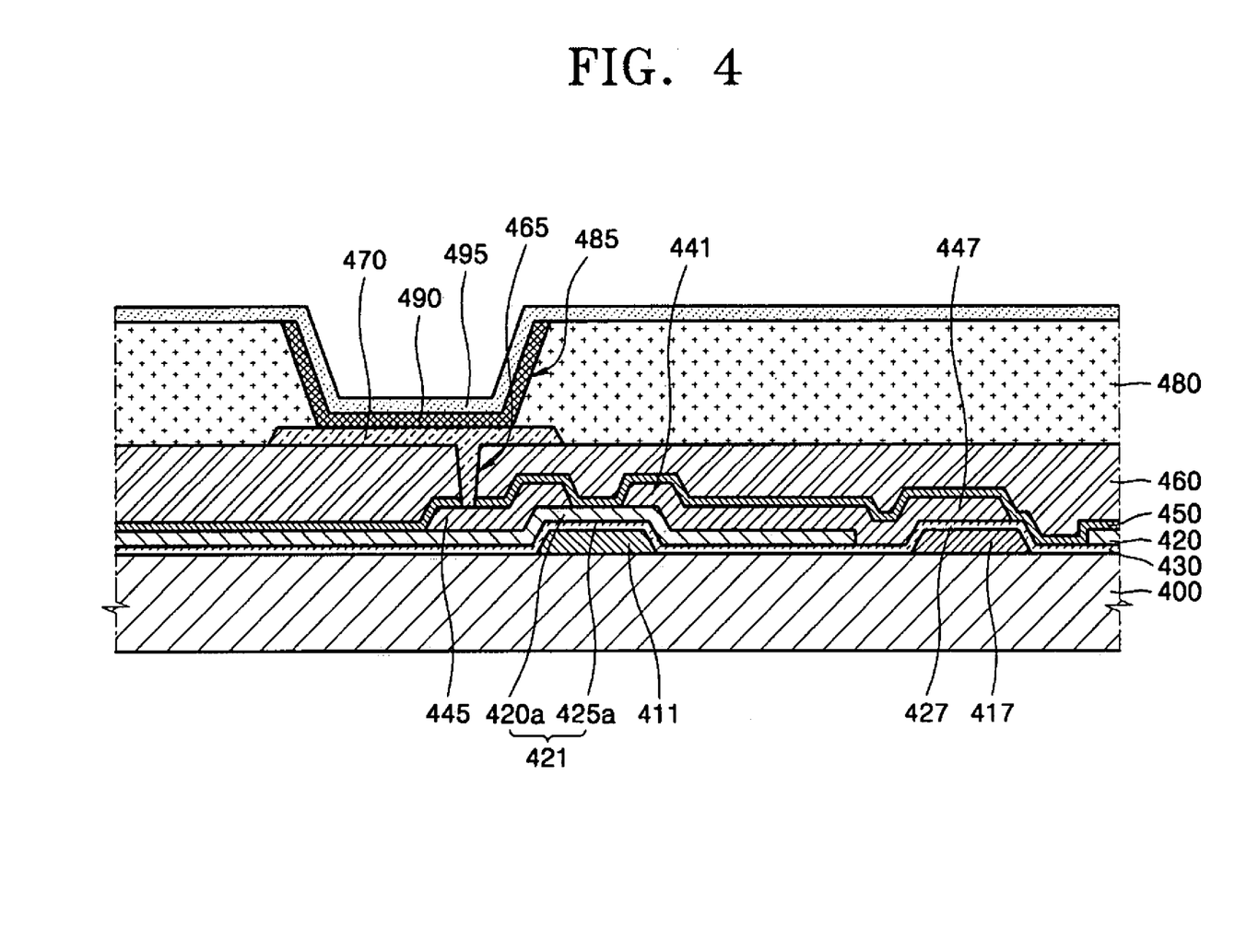
FIG. 4 is a sectional view of an organic electroluminescent display device having an OTFT according to another embodiment of the present invention.

FIG. 4 is a sectional view of an organic electroluminescent display device according to another embodiment of the present invention. FIG. 4 only shows a drive OTFT, a capacitor, and an organic electroluminescent element (EL) in one pixel, and illustrates a sectional structure taken along a line of III-III of FIG. 2.

The organic electroluminescent display device shown in FIG. 4 has substantially the same structure as that of the FIG. 3 device. However, the structure of the FIG. 4 device is different from that of FIG. 3 in that a gate insulating layer has a stack structure including an organic insulating layer and an inorganic insulating layer, and a capacitor dielectric is formed of an inorganic insulating layer.

Referring to FIG. 4, a gate electrode 411 and a capacitor lower electrode 417, which is formed of the same material as that of the gate electrode 411, are formed on a substrate 400. An inorganic insulating layer 430 is formed on the overall surface on the gate electrode 411, the lower electrode 417, and the substrate 400. In one embodiment, the inorganic insulating layer 430 includes at least one of the following: a silicon oxide layer and a silicon nitride layer, and a high-k insulating layer such as $Ta_2O_5$, $Y_2O_3$, $TiO_2$, BST, PZT, and BZT.

An organic insulating layer 420 is formed on the inorganic insulating layer 430 except for the capacitor region on the substrate 400. In one embodiment, the organic insulating layer 420 is formed of at least one of the following: BCB, polyimide, parylene, and PVP. In this embodiment, the organic insulating layer 420 is formed on the inorganic insulating layer 430 except for the capacitor region, using a patterning method by, for example, a laser ablation or photolithography and an etch process.

In another embodiment, the organic insulating layer 420 may use optical hardening resin such as negative photoresist or positive photoresist. In this embodiment, the organic insulating layer 420 may be formed on the inorganic insulating layer 430 except for the capacitor region, using a patterning method by, for example, a laser ablation process or exposure and a development process.

Here, the photolithography and etch process means a typical photolithography process using a photosensitive layer. The exposure and development process is performed to pattern the optical hardening resin, and means a process of patterning just by an exposure process and a development process without the use of a photosensitive layer.

In one embodiment, a portion 427 of the inorganic insulating layer 430 corresponding to the lower electrode 417 acts as a capacitor dielectric. Furthermore, i) a portion 425a of the inorganic insulating layer 430 corresponding to the gate electrode 411, and ii) a portion 420a of the organic insulating layer 420 corresponding to the gate electrode 411 act as a gate insulating layer 421 of the OTFT.

Thus, the gate insulating layer 421 of the TFT has a hybrid structure including the inorganic insulating layer 425a and the organic insulating layer 420a, and the capacitor dielectric 427 is formed by the inorganic insulating layer 430. Thus, an insulation property of the TFT can be maintained, and a capacitance of the capacitor can be sufficiently ensured. Further, since the capacitor dielectric 427 is formed of only the inorganic insulating layer 430, and the capacitor dielectric 427 is thinner than that of the insulating layer 120 used as the conventional gate insulating layer 121, a higher capacitance is obtained.

A source electrode 441 and a drain electrode 445 are formed on the organic insulating layer 420 to overlap both sides of the gate electrode 411. A capacitor upper electrode 447, which is connected to the source electrode 441, is formed on the inorganic insulating layer 430. The upper electrode 447 is formed of the same material as those of the source electrode 441 and the drain electrode 445, and is formed on the inorganic insulating layer 430 to overlap the lower electrode 417.

An organic semiconductor layer 450 is formed over the substrate 400, and a protecting layer 460 generally formed with an organic material is applied to the semiconductor layer 450. An anode electrode 470 is formed on the protecting layer 460, and the anode electrode 470 is connected to the drain electrode 445 through a viahole 465. A pixel definition layer 480 is formed on the protecting layer 460, and the pixel definition layer 480 has an opening 485 exposing a portion of the anode electrode 470. An organic layer 490 is formed on the anode electrode 470 exposed by the opening 485, and a cathode electrode 495 as an upper electrode is formed on the overall surface of the substrate 400.

In one embodiment, since the gate insulating layer of the OTFT is formed of an inorganic insulating layer and an organic insulating layer, and the capacitor dielectric is formed of an inorganic insulating layer that is thinner than that of the conventional gate insulating layer. Thus, the TFT is properly insulated and the capacitor has sufficient capacitance.

Figure 5:
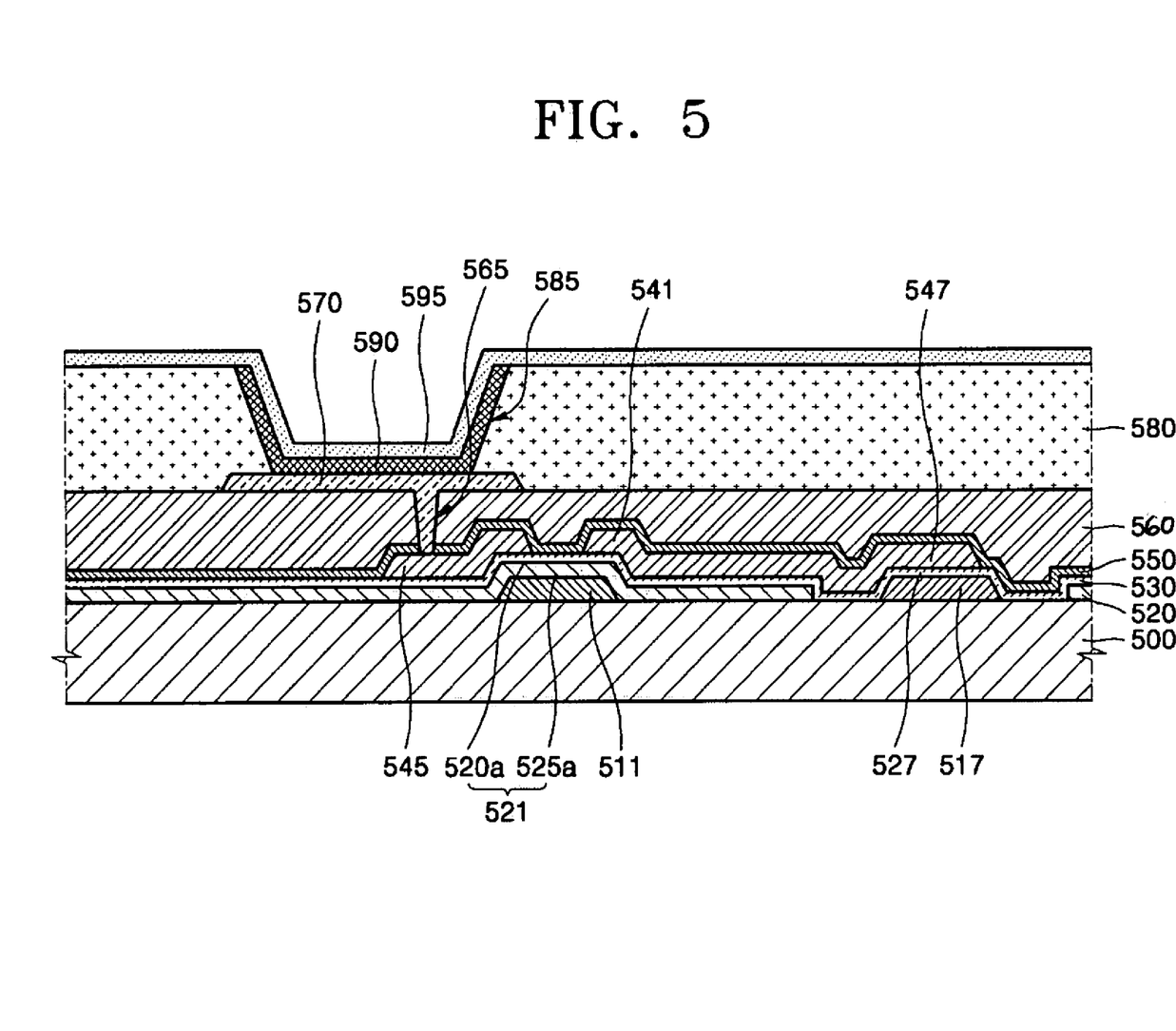
FIG. 5 is a sectional view of an organic electroluminescent display device having an OTFT according to still another embodiment of the present invention.

FIG. 5 is a sectional view of an organic electroluminescent display device according to still another embodiment of the present invention. FIG. 5 only shows a drive OTFT, a capacitor, and an organic electroluminescent element (EL) in one pixel, and illustrates a sectional structure taken along a line of III-III of FIG. 2.

The FIG. 5 embodiment has a structure in which a gate insulating layer has a hybrid structure including an organic insulating layer and an inorganic insulating layer, and a capacitor dielectric is formed of an inorganic insulating layer, like the FIG. 4 device. However, unlike other embodiments, an inorganic insulating layer 530 is stacked on an organic insulating layer 520.

Referring to FIG. 5, a gate electrode 511 and a capacitor lower electrode 517, which is formed of the same material as that of the gate electrode 511 as an example, are formed on a substrate 500. An organic insulating layer 520 is formed on the substrate 500 except for a capacitor region. In one embodiment, the organic insulating layer 520 is formed of at least one of the following: BCB, polyimide, parylene, and PVP. In this embodiment, the organic insulating layer 520 is formed on the substrate 500 except for the capacitor region, using a patterning method by, for example, a laser ablation process, or photolithography and an etch process.

In another embodiment, the organic insulating layer 520 may use optical hardening resin such as negative photoresist or positive photoresist. In this embodiment, the organic insulating layer 520 may be formed on the substrate 500 except for the capacitor region, using a patterning method by, for example, a laser ablation process or exposure and a development process.

Then, the inorganic insulating layer 530 is deposited on the overall surface of the substrate 500. In one embodiment, the inorganic insulating layer 530 includes at least one of the following: a silicon oxide layer and a silicon nitride layer, and a high-k insulating layer such as $Ta_2O_5$, $Y_2O_3$, $TiO_2$, BST, PZT, and BZT.

In one embodiment, i) a portion 525a of the organic insulating layer 520 corresponding to the gate 511 of the OTFT and ii) a portion 520a of the inorganic insulating layer 530 corresponding to the gate 511 act as a gate insulating layer 521 of the OTFT. Furthermore, a portion 527 of the inorganic insulating layer 530 corresponding to the capacitor lower electrode 517 acts as a capacitor dielectric.

Thus, since a gate insulating layer 521 having a hybrid structure including the organic insulating layer 525a and the inorganic insulating layer 520a is formed in a transistor region, and a capacitor dielectric as the inorganic insulating layer 527 is formed in a capacitor region, an insulation property and a capacitance can be ensured. Further, since the capacitor dielectric 527 is formed of only an inorganic insulating layer 525, and has a thickness thinner than that of the conventional gate insulating layer, a capacitance can be further increased.

A source electrode 541 and a drain electrode 545 are formed on the inorganic insulating layer 530 to overlap both sides of the gate electrode 511. A capacitor upper electrode 547, which is formed of the same material as those of the source electrode and the drain electrode, is formed on the inorganic insulating layer 530. The upper electrode 547 is connected to the source electrode 541, and is formed corresponding to the capacitor lower electrode 517.

An organic semiconductor layer 550 is formed on i) the source electrode 541, ii) the drain electrode 545, and iii) the inorganic insulating layer 530, and an organic protecting layer 560 is formed on the semiconductor layer 550. An anode electrode 570 as a pixel electrode is formed on the protecting layer 560, and is connected to the drain electrode 545 of the TFT through a viahole 565. A pixel definition layer 580 is formed over the substrate 500, and the pixel definition layer 580 has an opening 585 exposing a portion of the anode electrode 570. An organic layer 590 is formed on the anode electrode 570 inside the opening 585 formed in the pixel definition layer 580, and a cathode electrode 595 is formed on the overall surface of the substrate 500.

In one embodiment, since the gate insulating layer of the OTFT has a hybrid structure including an organic insulating layer and an inorganic insulating layer, and the capacitor dielectric is formed of an inorganic insulating layer, an insulation property of the TFT can be maintained, and a sufficient capacitance of the capacitor can be ensured. Further, since the capacitor dielectric is formed with a thickness thinner than that of the gate insulating layer used for the conventional capacitor dielectric, a capacitance can be further increased.

FIGS. 6A through 6D are sectional views of processing sequences illustrating a method of fabricating an organic electroluminescent display device having an OTFT according to an embodiment of the present invention, and only show a TFT and a capacitor.

Figure 6A:
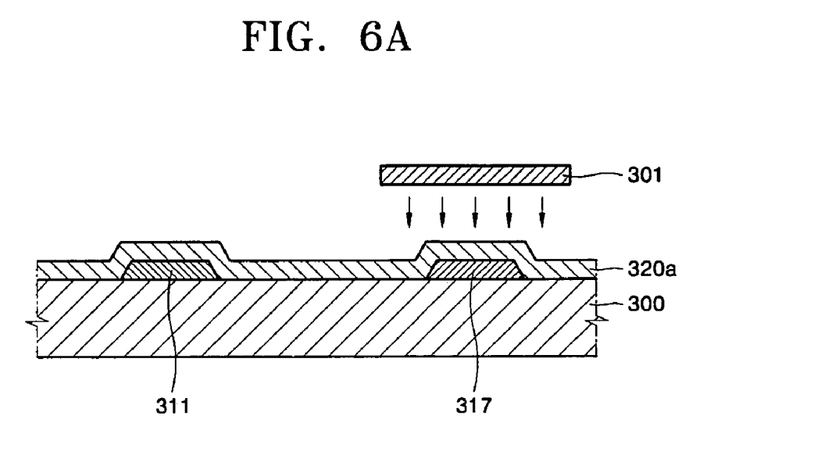
FIGS. 6A through 6D are sectional views of processing sequences illustrating a method of fabricating an organic electroluminescent display device having an OTFT according to an embodiment of the present invention.

As shown in FIG. 6A, a gate electrode material is deposited on a substrate 300, and is patterned, thereby forming a gate electrode 311 in a transistor region, and forming a capacitor lower electrode 317 in a capacitor region. Although not shown in the drawings, when the gate electrode 311 and the capacitor lower electrode 317 are formed, the gate line 210 of FIG. 2 is formed.

Then, an organic insulating layer 320a is deposited on the substrate 300 including the gate electrode 311 and the capacitor lower electrode 317. In one embodiment, the organic insulating layer 320a may be formed of at least one of the following materials: BCB, parylene, polyimide, PVP, and the like, or optical hardening resin.

Figure 6B:
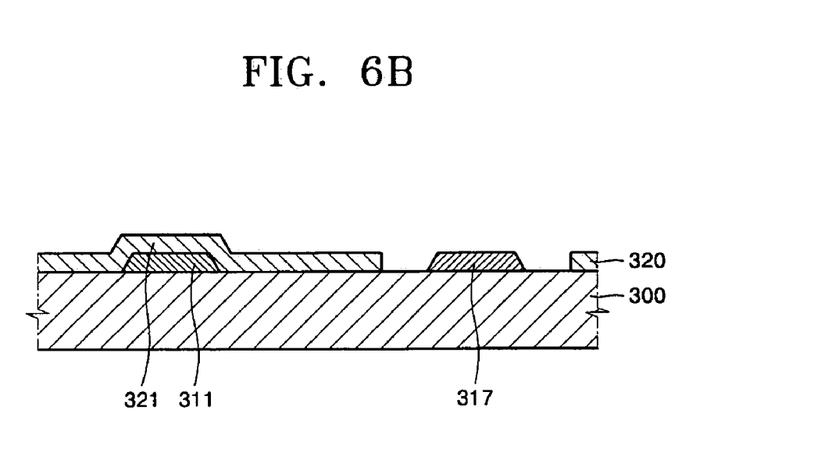

In one embodiment, a laser ablation treatment (LAT) 301 is performed to remove a portion corresponding to the capacitor region of the organic insulating layer 320a. Thus, as shown in FIG. 6B, the portion corresponding to the capacitor region of the organic insulating layer 320a is removed by the laser ablation.

In one embodiment, as a method of removing the portion corresponding to the capacitor region of the organic insulating layer 320a, only a portion corresponding to the capacitor region can be removed through a typical photolithography and etch process and a patterning process. In another embodiment, in the case of using optical hardening resin as the organic insulating layer 320a, a portion of the organic insulating layer 320a corresponding to the capacitor region can be removed through an exposure and development process.

Figure 6C:
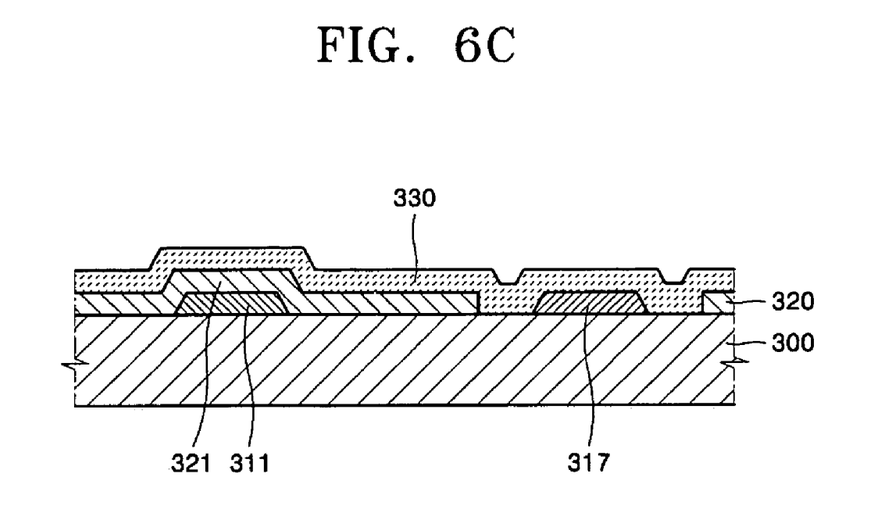
Figure 6D:
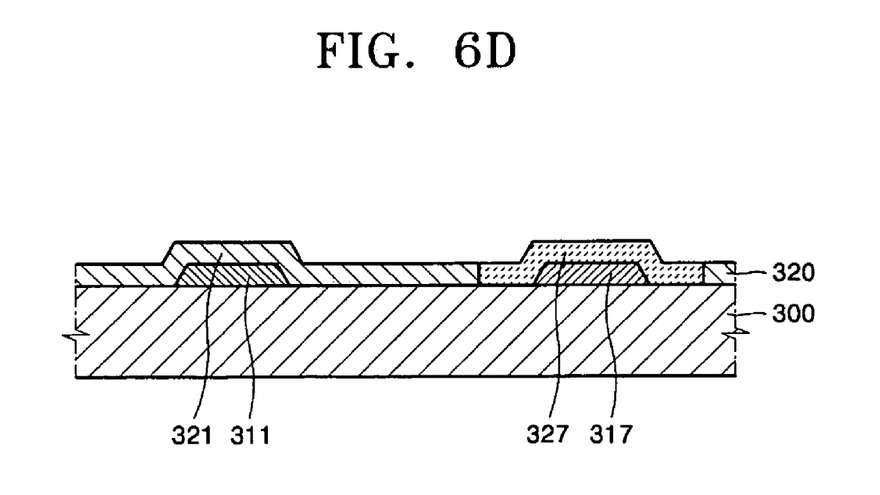

As shown in FIG. 6C, after an inorganic insulating layer 330 is deposited on the overall surface of the substrate 300, it is patterned to remain only in the capacitor region from which the organic insulating layer 320a is removed, as shown in FIG. 6D, thereby forming an inorganic insulating layer 327 used for a capacitor dielectric layer. Thus, the inorganic insulating layer 327 is formed as a capacitor dielectric in the capacitor region, and the organic gate insulating layer 321 is formed in the transistor region.

Subsequent processes are the same as the processes of a typical method of fabricating an organic electroluminescent display device having an OTFT. In the above embodiment, the capacitor dielectric 327 is formed of an inorganic insulating layer after the organic gate insulating layer 321 is formed, but it is possible to form the gate insulating layer 321 after forming the inorganic capacitor dielectric insulating layer.

Hereinafter, a method of fabricating an organic electroluminescent display device illustrated in FIG. 4 will be explained.

First, the gate electrode 411 and the capacitor lower electrode 417 are formed on the substrate 400, and then, the inorganic insulating layer 430 is deposited on the overall surface of the substrate. The organic insulating layer 420 is deposited on the inorganic insulating layer 430, and then, the organic insulating 420 corresponding to a capacitor region is removed. The organic insulating 420 corresponding to the capacitor region can be removed by, for example, a laser ablation treatment, a photolithography and etch process using a photosensitive layer, or an exposure and development process.

Thus, the gate insulating layer 421 having a hybrid structure including the inorganic insulating layer 425a and the organic insulating layer 420a is formed in the transistor region, and the inorganic capacitor insulating layer 430 is formed in the capacitor region. Subsequent processes are performed in the same manners as those of the above embodiment.

Then, a method of fabricating an organic electroluminescent display device illustrated in FIG. 5 will be explained.

First, after the gate electrode 511 and the capacitor lower electrode 517 are formed on the substrate 500, the organic insulating layer 520 is deposited on the overall surface of the substrate 500. A portion of the organic insulating layer 520 corresponding to the capacitor region is removed. The portion of the organic insulating layer 520 corresponding to the capacitor region can be removed by, for example, a laser ablation treatment, a photolithography and etch process using a photosensitive layer, or an exposure and development process.

Then, the inorganic insulating layer 530 is deposited on the overall surface of the substrate including the organic insulating layer 520. Thus, the gate insulating layer 521 having a hybrid structure including the organic insulating layer 520a and the inorganic insulating layer 525a is formed in a transistor region, and the inorganic capacitor insulating layer 530 is formed in the capacitor region. Subsequent processes are performed in the same manners as those of the above embodiment.

The embodiments of the present invention have described an organic electroluminescent display device having an OTFT with a bottom contact structure. However, an organic electroluminescent display device having an OTFT with a top contact structure and an organic electroluminescent display device with a top gate structure can maintain an insulation property and ensure a sufficient capacitance, by forming an organic gate insulating layer and forming an inorganic capacitor insulating layer.

The above embodiments have been described based on an organic electroluminescent display device having an OTFT as a switching element. However, those embodiments can be also employed to a flat display device such as a liquid crystal display device using an OTFT as a switching element, thereby maintaining an insulation property and ensuring a sufficient capacitance.

One embodiment of the present invention has an advantage that an insulation property of the TFT can be maintained by using an organic insulating layer for a gate insulating layer, and a sufficient capacitance can be ensured by using an inorganic insulating layer for a capacitor dielectric.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A flat display device, comprising:
   a substrate having a capacitor region and a transistor region;

a thin film transistor (TFT) formed in the transistor region of the substrate, and having a gate electrode, an organic semiconductor layer, a source electrode, and a drain electrode;

a capacitor formed in the capacitor region of the substrate, and having a lower electrode and an upper electrode;

a display element connected to one of the source and drain electrodes of the TFT;

a gate insulating layer, including at least an organic insulating layer, formed below or on the gate electrode of the TFT; and an inorganic capacitor insulating layer formed between the upper and lower electrodes of the capacitor, wherein the source electrode contacts the organic insulating layer and inorganic capacitor insulating layer, and wherein the inorganic capacitor insulating layer contacts both the lower and upper electrodes of the capacitor.

2. The flat display device according to claim 1, wherein the organic semiconductor layer of the TFT is formed of at least one of the following: pentacene, tetracene, anthracene, naphthalene, alpha-6-thiophene, perylene, and its derivatives; rubrene and its derivatives; coronene and its derivatives; perylene tetracarboxylic diimide and its derivatives; perylene tetracarboxylic dianhydride and its derivatives; polythiophene and us derivatives; poly para perylene vinylene and its derivatives; polyfloren and its derivatives; and polythiophene vinylene and its derivatives.

3. The flat display device according to claim 1, wherein the gate insulating layer further includes an inorganic insulating layer formed below or on the organic insulating layer.

4. The flat display device according to claim 1, wherein the inorganic capacitor insulating layer has a thickness substantially equal to or less than that of the organic gate insulating layer.

5. The flat display device according to claim 1, wherein the inorganic capacitor insulating layer includes at least one of the following: a silicon oxide layer and a silicon nitride layer, or a high-k inorganic insulating layer, and the gate insulating layer includes an organic insulating layer selected from polyimide, BCB, parylene, PVP, and optical hardening resin.

6. A method of fabricating a flat display device, comprising:

providing a substrate having a capacitor region and a transistor region;

forming a thin film transistor (TFT) in the transistor region of the substrate, the TFT having a gate electrode, an organic semiconductor layer, a source electrode, and a drain electrode;

forming a capacitor, having a lower electrode and an upper electrode, in the capacitor region of the substrate;

connecting a display element to the TFT;

preparing a substrate having the lower electrode in the capacitor region and the gate electrode in the transistor region; and forming an inorganic capacitor insulating layer between the lower and upper electrodes, and forming a gate insulating layer including at least an organic insulating layer in the transistor region, wherein the source electrode contacts the organic insulating layer and inorganic capacitor insulating layer, and wherein the inorganic capacitor insulating layer contacts both the lower and upper electrodes of the capacitor.

7. The method according to claim 6, wherein the organic semiconductor layer of the TFT is formed of at least one of the following: pentacene, tetracene, anthracene, naphthalene, alpha-6-thiophene, perylene, and its derivatives; rubrene and its derivatives; coronene and its derivatives; perylene tetra-carboxylic diimide and its derivatives; perylene tetracarboxylic dianhydride and its derivatives; polythiophene and its derivatives; poly para perylene vinylene and its derivatives; polyfloren and its derivatives; and polythiophene vinylene and its derivatives.

8. The method according to claim 6, wherein the inorganic capacitor insulating layer has a thickness substantially equal to or thinner than that of the gate insulating layer.

9. The method according to claim 6, wherein the inorganic capacitor insulating layer includes at least one of the following: a silicon oxide layer and a silicon nitride layer, or a high-k inorganic insulating layer, and the gate insulating layer includes an organic insulating layer selected from polyimide, BCB, parylene, PVP, and optical hardening resin.

10. The method according to claim 6, wherein the forming the gate insulating layer and the inorganic capacitor insulating layer comprises:

forming an organic insulating layer on the overall surface of the substrate;

removing the organic insulating layer from the capacitor region;

forming an inorganic insulating layer on the substrate; and patterning the inorganic insulating layer, thereby leaving the inorganic insulating layer only in the capacitor region from which the organic insulating layer is removed.

11. The method according to claim 10, wherein the organic insulating layer of the capacitor region is removed by a process selected from a laser ablation process, a photolithography and etch process, and an exposure and development process.

12. The method according to claim 6, wherein the forming the gate insulating layer and the inorganic capacitor insulating layer comprises:

forming an inorganic insulating layer on the overall surface of the substrate;

removing the inorganic insulating layer from the transistor region;

forming an organic insulating layer on the substrate; and leaving the organic insulating layer only in the transistor region from which the inorganic insulating layer is removed.

13. The method according to claim 12, wherein the leaving is performed by a process selected from a laser ablation process, a photolithography and etch process, and an exposure and development process.

14. The method according to claim 6, wherein the forming the gate insulating layer and the inorganic capacitor insulating layer comprises:

forming an inorganic insulating layer on the overall surface of the substrate;

forming an organic insulating layer on the inorganic insulating layer; and removing the organic insulating layer from the capacitor region such that the gate insulating layer includes the inorganic insulating layer and the organic insulating layer.

15. The method according to claim 14, wherein the organic insulating layer of the capacitor region is removed by a process selected from a laser ablation process, a photolithography and etch process, and an exposure and development process.

16. The method according to claim 6, wherein the forming the gate insulating layer and the inorganic capacitor insulating layer comprises:

forming an organic insulating layer on the overall surface of the substrate;

removing the organic insulating layer from the capacitor region; and forming an inorganic insulating layer on the overall surface of the substrate such that the gate insulating layer includes the inorganic insulating layer and the organic insulating layer.

17. The method according to claim 16, wherein the organic insulating layer of the capacitor region is removed by a process selected from a laser ablation process, a photolithography and etch process, and an exposure and development process.

18. A structure for a flat display device including at least one thin film transistor (TFT) and a capacitor in a pixel circuit, the structure comprising:

a gate insulating layer formed from an organic material and formed between i) a source electrode and a drain electrode and ii) a gate electrode of the TFT; and an inorganic capacitor insulating layer formed between upper and lower electrodes of the capacitor, wherein the source electrode contacts the gate insulating layer and inorganic capacitor insulating layer, and wherein the inorganic capacitor insulating layer contacts both the lower and upper electrodes of the capacitor.

19. The structure according to claim 18, wherein the gate insulating layer further includes an inorganic insulating layer formed below or on the organic insulating layer.

20. The structure according to claim 19, wherein the inorganic gate insulating layer and the inorganic capacitor insulating layer are formed together in the same layer.

21. A method of fabricating a flat display device, comprising:

forming an organic gate insulating layer between i) a source electrode and a drain electrode and ii) a gate electrode of a thin film transistor (TFT); and forming an inorganic capacitor insulating layer between lower and upper electrodes of a capacitor, wherein the source electrode contacts the organic gate insulating layer and inorganic capacitor insulating layer, and wherein the inorganic capacitor insulating layer contacts both the lower and upper electrodes of the capacitor.

22. The flat display device according to claim 1, wherein the organic insulating layer and inorganic capacitor insulating layer contact each other.

23. The method according to claim 6, wherein the organic insulating layer and inorganic capacitor insulating layer contact each other.

24. The structure according to claim 18, wherein the gate insulating layer and inorganic capacitor insulating layer contact each other.

25. The method according to claim 21, wherein the organic gate insulating layer and inorganic capacitor insulating layer contact each other.

* * * * *

UNITED STATES PATENT AND TRADEMARK OFFICE
CERTIFICATE OF CORRECTION

PATENT NO. : 7,655,943 B2 Page 1 of 1
APPLICATION NO. : 11/253198
DATED : February 2, 2010
INVENTOR(S) : Lee et al.

It is certified that error appears in the above-identified patent and that said Letters Patent is hereby corrected as shown below:

| Column | Line | Description of Errors |
|--------|------|------------------------|
| 11 | 25 | In Claim 2, change "us" to --its--. |

Signed and Sealed this

Seventh Day of September, 2010

David J. Kappos
*Director of the United States Patent and Trademark Office*